United States Patent [19]

Nagase

[11] Patent Number: 5,768,144
[45] Date of Patent: Jun. 16, 1998

[54] SYSTEM FOR SUPPORTING DATA ANALYSIS IN VLSI PROCESS

[75] Inventor: Keiji Nagase, Tenri, Japan

[73] Assignee: Sharp Kabushiki Kaisha, Osaka, Japan

[21] Appl. No.: 164,458

[22] Filed: Dec. 9, 1993

[30] Foreign Application Priority Data

Dec. 18, 1992 [JP] Japan .................................. 4-337724

[51] Int. Cl.$^6$ ........................................... G06F 17/50
[52] U.S. Cl. ........................ 364/488; 364/468; 364/489; 364/490
[58] Field of Search ........................ 364/468, 488, 364/489, 490, 491; 395/600, 650

[56] References Cited

U.S. PATENT DOCUMENTS

| | | | |
|---|---|---|---|
| 5,150,308 | 9/1992 | Hooper et al. | 364/489 |
| 5,272,641 | 12/1993 | Ford et al. | 364/468 |
| 5,311,424 | 5/1994 | Mukherjee et al. | 364/401 |
| 5,321,605 | 6/1994 | Chapman et al. | 364/402 |
| 5,339,247 | 8/1994 | Kirihara et al. | 364/468 |
| 5,355,320 | 10/1994 | Erjavic et al. | 364/488 |
| 5,375,062 | 12/1994 | Aoki | 364/468 |
| 5,392,220 | 2/1995 | Van Den Hamer et al. | 364/488 |
| 5,455,948 | 10/1995 | Poole et al. | 395/650 |
| 5,465,351 | 11/1995 | Lemmo | 395/600 |
| 5,504,921 | 4/1996 | Dev et al. | 395/800 |

OTHER PUBLICATIONS

Taylor, "An Analysis of ATE Computational Architecture," 1990 Int'l Test Conf., paper 25.1, pp. 514–519.

K. Kotani and S. Kawazu, "Data Collecting and Processing Method for Semiconductor Process", Journal of Institute of Electrical Engineers of Japan, pp. 219–222; 1986.

*Primary Examiner*—Kevin J. Teska
*Assistant Examiner*—Leigh Marie Garbowski

[57] ABSTRACT

A system for supporting data analysis in a VLSI producing process is arranged to flexibly correspond to any data analysis requested by a system user. The system basically includes a registering unit for registering data in a database, an extracting unit for extracting necessary data from the registering unit, a processing unit for processing the extracted data, and a data statistical processing unit for producing statics from the extracted or processed data. In the registering unit, the data is stored as a collected data relation group for storing data and a common index information relation group for an index and a history of a processed wafer. Both of the relation groups are coupled through an index information key consisting of a process ID, a producing step ID, a lot ID and a wafer ID provided in both of the relation groups. In the extracting unit, two independent modules are provided so as to communicate one with another. In the working or statistical processing unit, the items to be selected are displayed on the screen in a hierarchical manner.

12 Claims, 13 Drawing Sheets

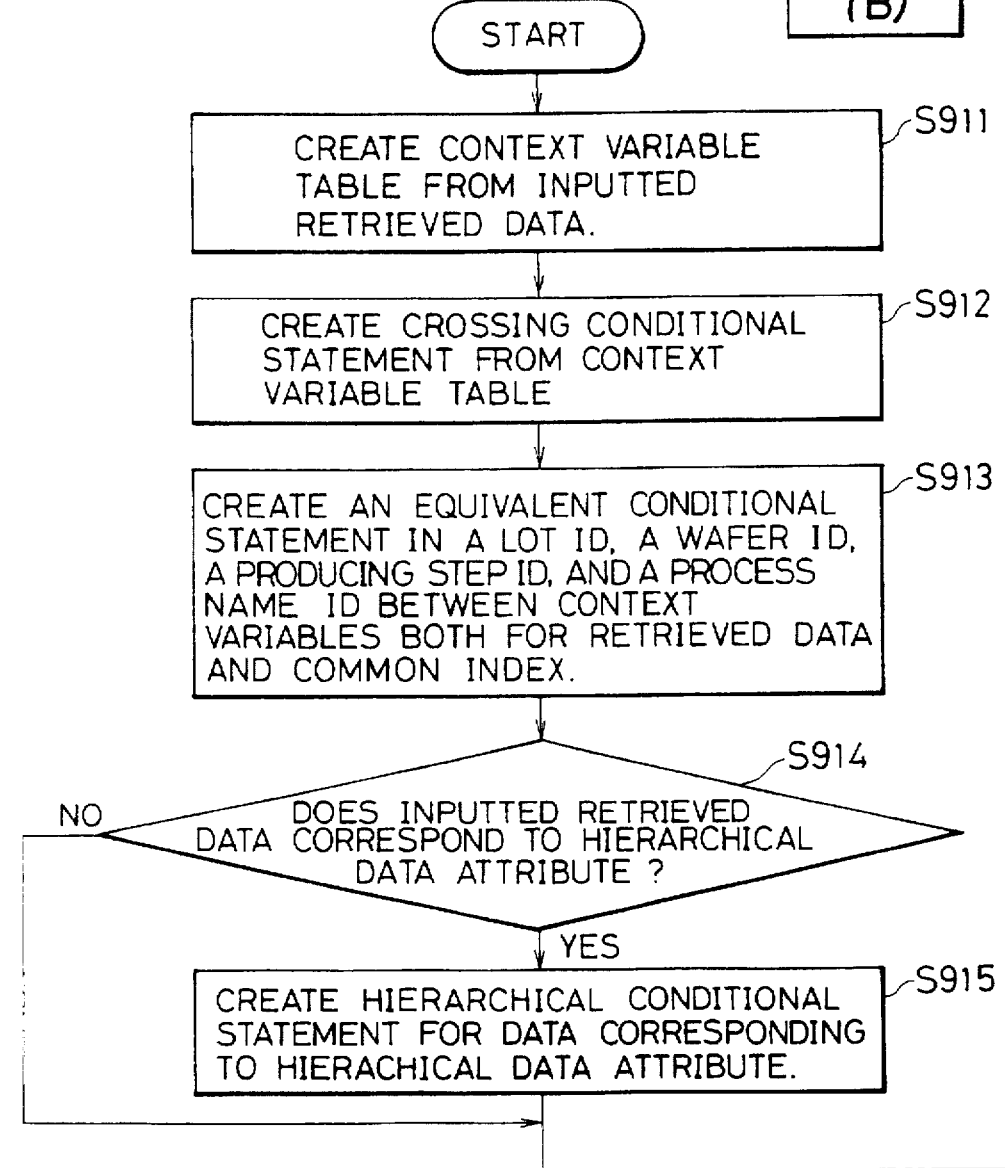

Fig. 6

| | L (DESIGN) AND Vth |
|---|---|
| S911 | CONTEXT TABLE <br><br> \| SPECIFIED DATA \| COMMON INDEX CONTEXT \| RETRIEVED DATA CONTEXT \| <br> \| L \| A1 \| B \| <br> \| Vth \| A2 \| B \| |
| S912 | A1 IN INDEX_KEY_REL CROSS A2 IN INDEX_KEY_REL CROSS B IN DC_PARAMETRIC_TEST_REL |
| S913 | (A1. LOT_ID=B. LOT_ID) AND <br> (A1. WAFER_ID=B. WAFER_ID) AND <br> (A1. STEP_ID=B. STEP_ID) AND <br> (A1. PROCESS_NAME_ID=B.PROCESS_NAME_ID) AND <br> (A2. LOT_ID=B. LOT_ID) AND <br> ⋮ |
| S915 | (B. MEASURE_PARAMETER_L1_VALUE>=0.5) AND <br> (B. MEASURE_PARAMETER_L1_VALUE<=1.5) AND <br> (B. MEASURE_PARAMETER_W1_VALUE<=10) AND <br> (B. MEASURE_PARAMETER_W1_VALUE<=100) AND |
| S916 | (A1. PROCESS_NAME_ID="NWLH") AND <br> (A2. PROCESS_NAME_ID="NWLH") AND <br> (A1. STEP_ID="DCTEST01") AND <br> (A2. STEP_ID="DCTEST01") AND <br> (A1. WAFER_ID="W01") AND (A2.WAFER_ID="W01") AND <br> (A1. LOT_ID="LOT01") AND (A2. LOT_ID="LOT01") AND |
| S918 | NO EXAMPLE |
| S920 | NO EXAMPLE |

Fig. 7

| | Tox AND Vth | | |
|---|---|---|---|
| S911 | CONTEXT TABLE | | |
| | SPECIFIED DATA | COMMON INDEX CONTEXT | RETRIEVED DATA CONTEXT |
| | Tox | A1 | B |
| | Vth | A2 | C |
| S912 | A1 IN INDEX_KEY_REL CROSS A2 IN INDEX_KEY_REL CROSS B IN MEASURE_TOX_REL CROSS C IN DC_PARAMETRIC_TEST_REL | | |
| S913 | (A1. LOT_ID = B. LOT_ID) AND<br>(A1. WAFER_ID = B. WAFER_ID) AND<br>(A1. STEP_ID = B. STEP_ID) AND<br>(A1. PROCESS_NAME_ID = B. PROCESS_NAME_ID) AND<br>(A2. LOT_ID = C. LOT_ID) AND<br>: | | |
| S915 | (C. MEASURE_PARAMETER_L1_VALUE >= 0.5) AND<br>(C. MEASURE_PARAMETER_L1_VALUE <= 1.5) AND<br>(C. MEASURE_PARAMETER_W1_VALUE <= 10) AND<br>(C. MEASURE_PARAMETER_W1_VALUE <= 100) AND | | |
| S916 | (A1. PROCESS_NAME_ID = "NWLH") AND<br>(A2. PROCESS_NAME_ID = "NWLH") AND<br>(A1. STEP_ID = "1ST_TOX") AND<br>(A2. STEP_ID = "DCTEST01") AND<br>(A1. WAFER_ID = "W01") AND (A2. WAFER_ID = "W01") AND<br>(A1. LOT_ID = "LOT01") AND (A2. LOT_ID = "LOT01") AND | | |
| S918 | NO EXAMPLE | | |
| S920 | (B. LOT_ID = C. LOT_ID) AND<br>(B. WAFER_ID = C. WAFER_ID) | | |

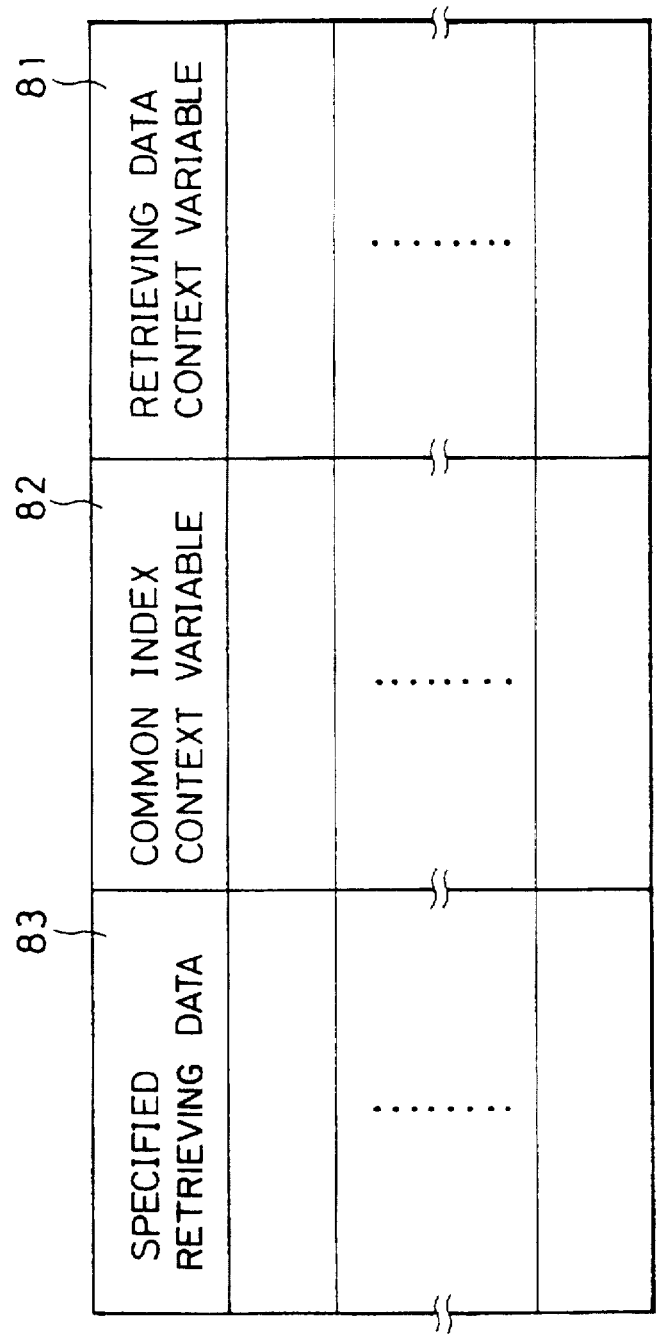

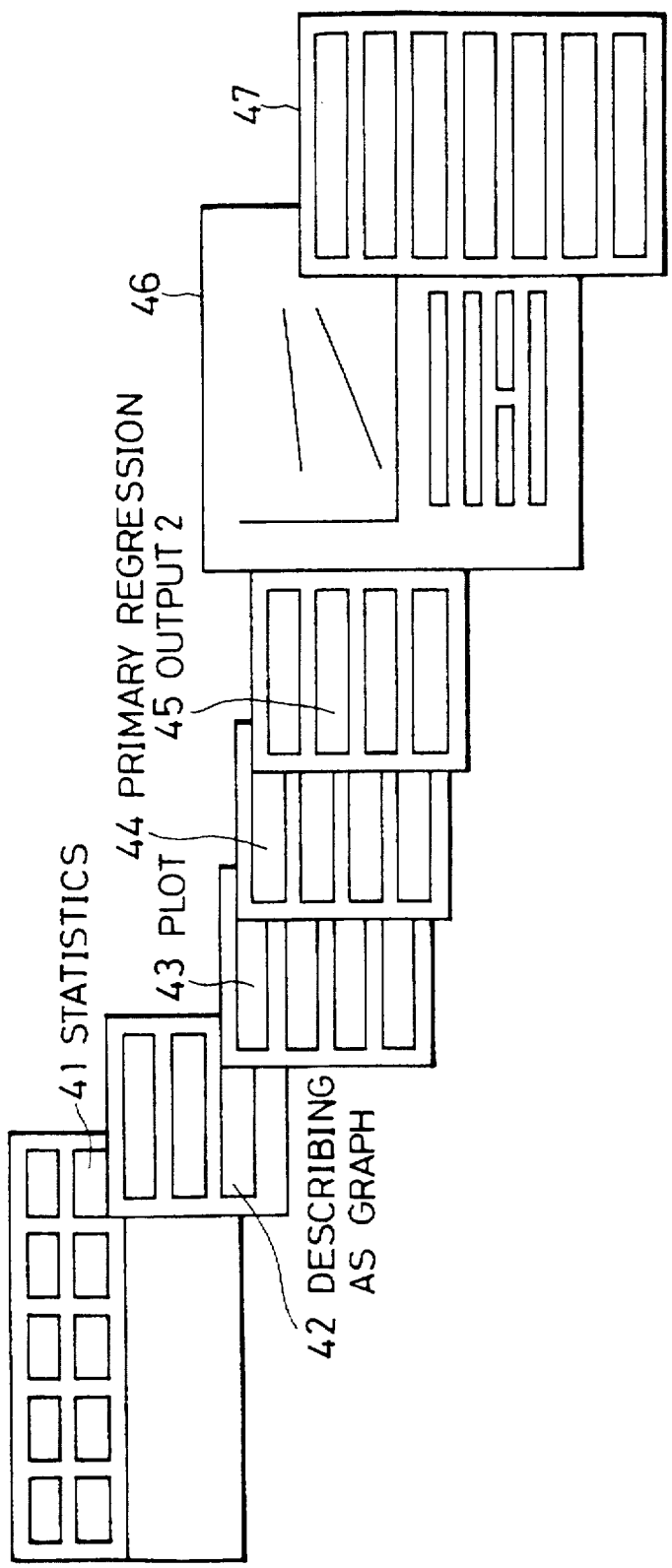

SYSTEM FOR SUPPORTING DATA ANALYSIS IN VLSI PROCESS

BACKGROUND OF THE INVENTION

1. Field of the Invention

The present invention relates to a system for supporting data analysis in a VLSI process, and more particularly to a system which is capable of efficiently deriving a process parameter(s) (condition), analyzing device characteristics and improving yields of a semiconductor device in developing a process for a semiconductor electronic device such as a VLSI device.

2. Description of the Background Art

The relation between flow of data analysis known by the applicant and the corresponding processing system will be described as background by referring to FIGS. 1a–1c. The data analysis described herein will be oriented to analysis of device characteristics.

FIG. 1a shows a flow of a database system 21 for extracting data about electric characteristics, data about a producing process or measuring data after production which data are used for analyzing device characteristics. As shown, the database system 21 executes the operations at steps S24 and S25. At the step S24, the collected data is registered in the database. At the step S25, the data is extracted from the database. The extracted data is processed by using a data processing system 22 as shown in FIG. 1b. For example, an abnormal measured value is deleted from the extracted data. The data processing system 22 executes the operations at steps S26 and S27. At the step S26, the format of the inputted data is converted into the format matched to the data processing system 22. At the step S27, the data is processed. For example, an abnormal measured value is deleted from the data. The extracted and processed data is sent to a statistical processing system 23 as shown in FIG. 1c. The statistical processing system 23 operates to perform a statistical process about the data such as describing the data as a graph. The system 23 thus enables to derive correlative results about device characteristics. The statistical processing system 23 executes the operations at steps S28 and S29 shown in FIG. 1c. At the step S28, the format of the inputted data is converted into the format matched to the system 23. At the step S29, the statistical processing of the data such as describing the data as a graph is executed for deriving the correlative results about the device characteristics. These systems 21 to 23 operate independently of each other, so that each system may have different corresponding data formats. It means that the user has to take a troublesome step of converting the data format when the data is sent to each system for processing the data or deriving the statistics of the data. The data formats are respective in the data processing system and the statistical processing system. In this known art, this troublesome step corresponds to the steps S26 and S28. This is a disadvantage the known art involves.

Furthermore, the independent systems inhibit implementation of a consistent operating environment along a flow of data analysis. These independent systems require the user to learn the operating commands of each system. It means that the user has to do troublesome and intricate operations. This is another disadvantage.

In each operation of storage of data in the database, extraction of data from the database, processing of data and statistical processing of data, each system provides a fixed processing pattern so that it cannot flexibly cope with the data analysis according to the request of the system user. This is another disadvantage.

SUMMARY OF THE INVENTION

It is an object of the present invention to provide a system for supporting data analysis in developing a VLSI process which implements such a data analyzing environment that a system user or a process developer may dedicatedly consider the data given by the system, that is, a consistent data analyzing system along a flow of data analysis without having to convert the data format in each system stage.

In carrying out the object, a system for supporting data analysis in a VLSI process includes: a data register for registering to a database data about a producing process, measured data after production, and data about electric characteristics, all the data being collected in the VLSI process; a data extractor for extracting data used for data analysis from the database; a data processor for processing the extracted data; and a statistical processor for performing statistical processing with respect to the data extracted from the database or the processed data.

The register may register in the database collected data relation groups for storing the data about a producing process, the measured data after production, and the data about electric characteristics and a common index information relation group for storing an index and a history of each processed wafer are coupled through an index information key consisting of a process ID, a producing step ID, a lot ID and a wafer ID provided in both of the relation groups.

The data extractor may provide for dynamically creating a record selecting formula standing for a record extracting condition by using a retrieved data context variable table and a common index information context variable table in the relations and for extracting data in a manner to independently separate a client module for creating the record selecting formula and retrieve request information from a server module for creating a data retrieving program based on the retrieve request information and executing the data retrieving program and to communicate the client module with the server module.

The data processor and the data statistical processor may provide data management for relating a data entity with its data attribute when storing data and selection for selecting hierarchically grouped operational items on their corresponding windows.

In operation, in extracting data from the database, for making data retrieval more flexible, a record selecting formula is dynamically created based on an algorithm for creating the formula by using the relational coupling patterns in retrieving data. This makes it possible for the supporting system to flexibly correspond to any data analysis requested by each system user.

Moreover, the client module for creating the record selecting formula and the retrieval request is operated separately from the server module for creating the retrieving program based on the retrieval request so that the client module may communicate with the server module. This communication results in distributing the processing load to be imposed on the data extraction.

The data extracted from the database is related with the data to be processed or statistically-processed in light of files indicating a data entity and its data attribute. This relation makes it possible for a computer itself to automatically execute the data format conversion requested by the system user before the processing or the statistical processing stage. Hence, the system user does not need to do a troublesome data conversion operation.

The system user enables analysis of data through the window system so that the user may easily perform the necessary operations without having to learn complicated commands of a tool software executed inside of the data working system and the statistical processing system.

The system user or a VLSI process developer, therefore, can dedicatedly consider the resulting data given by the system. This results in more quickly analyzing data as keeping the data analysis at high level.

Further objects and advantages of the present invention will be apparent from the following description of the preferred embodiment of the invention as illustrated in the accompanying drawings.

BRIEF DESCRIPTION OF THE DRAWINGS

FIG. 5, comprising FIGS. 5A–5B, is a flowchart showing an algorithm for creating a record selecting formula used for retrieving data according to the present invention;

FIG. 6 is a table showing a flow of creating the record selecting formula shown in FIG. 5;

FIG. 7 is a table showing another flow of creating the record selecting formula shown in FIG. 5;

FIG. 8 is a view showing a context variable table used in retrieving data;

FIG. 10 is a view showing an operating window screen used for statistical processing.

DESCRIPTION OF THE PREFERRED EMBODIMENT

Figure 1A:
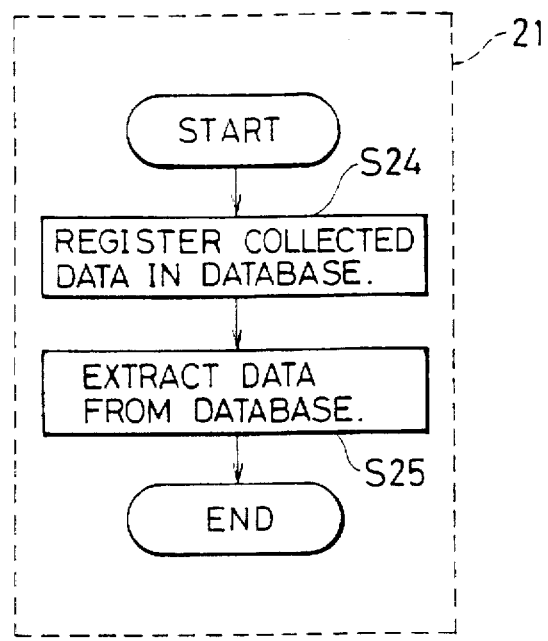
FIGS. 1a to 1c are flowcharts showing a known data analyzing flow and a processing system for executing the flow.
Figure 1B:
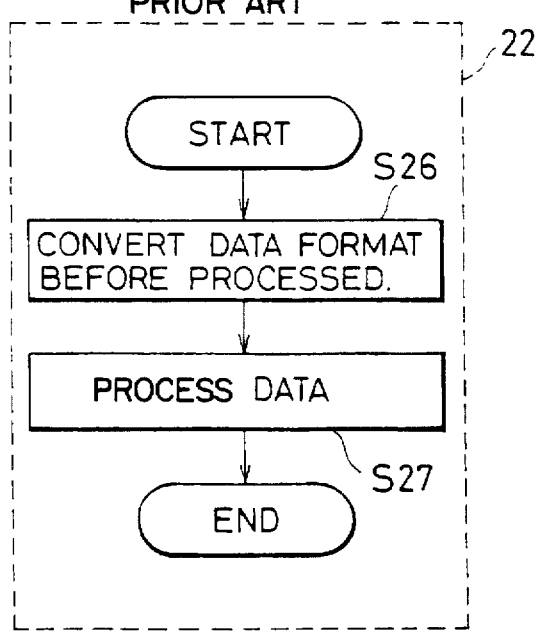
Figure 1C:
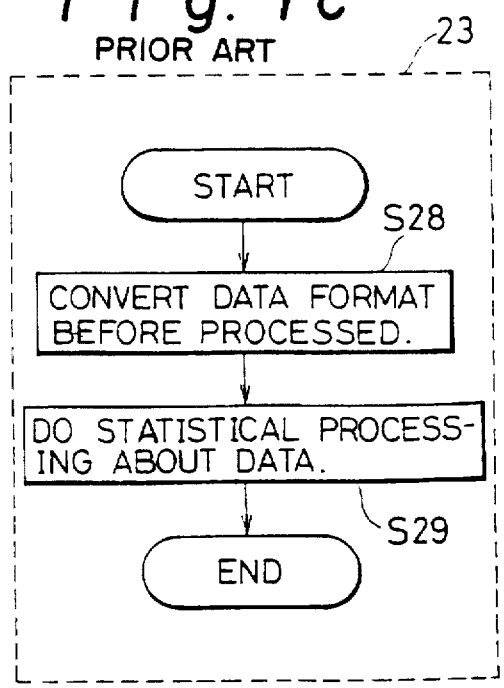
Figure 2:
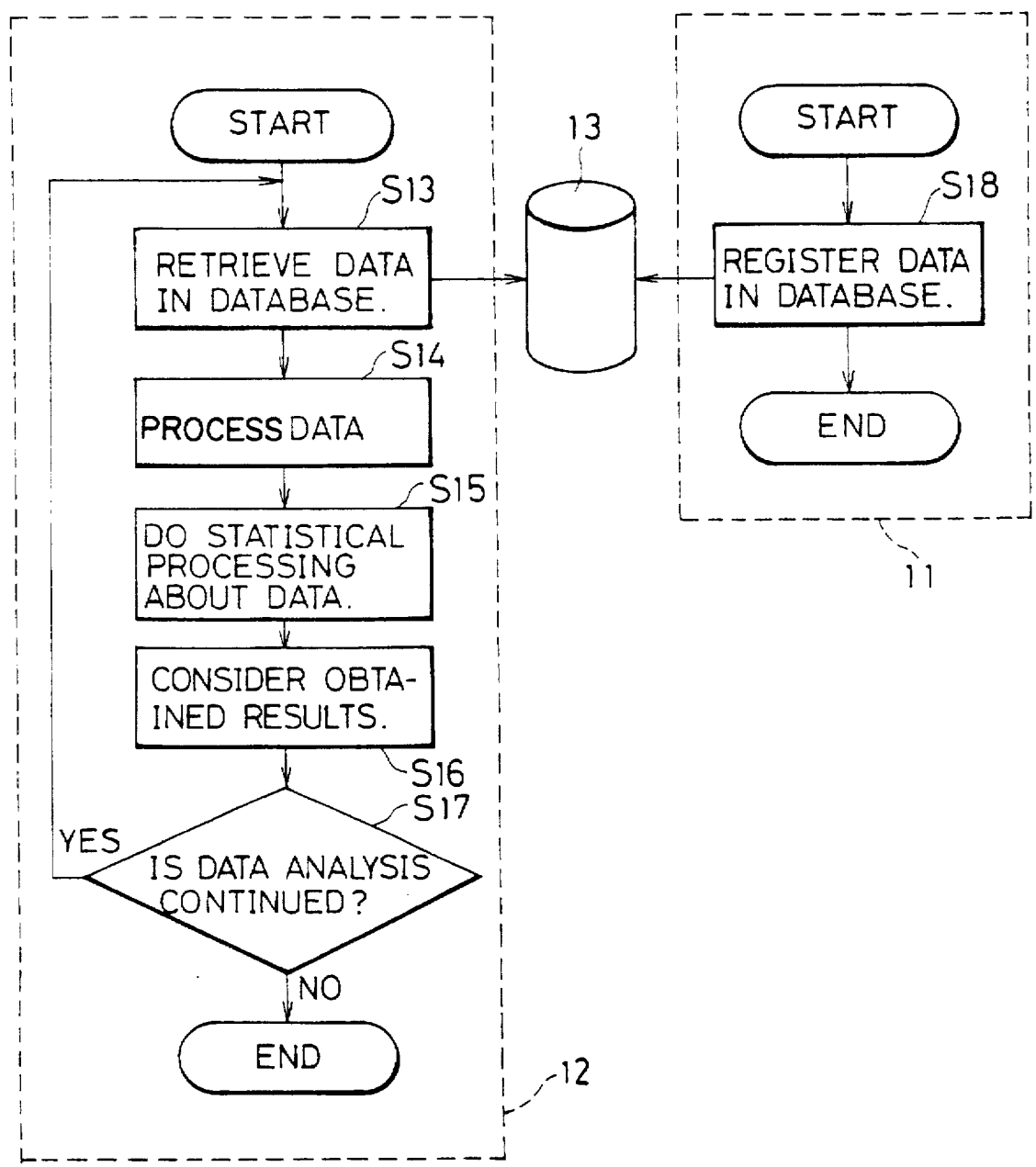
FIG. 2 is a flowchart showing a flow of data analysis implemented according to an embodiment of the present invention.

The description will be oriented to a system for supporting data analysis in a VLSI process according to an embodiment of the present invention. FIG. 2 is a flowchart showing a process executed by the system. As is obvious from the flowchart, the data analyzing process in the broad sense may be roughly divided into two subprocesses. One is a data registering process 11 for registering into a database data about a producing process, measured data after production, and data about electric characteristics (step S18 in FIG. 2). The other one is a data analyzing process 12 for actually doing analysis between pieces of target data. A numeral 3 denotes a database for registering the processing data, the measured data after production and the data about electric characteristics. The database is realized by a magnetic disk. The data analyzing process is, as shown, composed of five operations at steps S13 to S17. At the step S13, the data to be analyzed is extracted from the database. At the step S14, the extracted data is processed. Concretely, an abnormal measured value is deleted from the extracted data or the data is derived according to a model, for example. At the step S15, the data extracted from the database or the processed data is statistically processed such as describing the data as a graph or regression analysis of the data. At the step S16, the processed result is carefully considered by a system user. At the step S17, it is determined whether or not the data analysis is to be continued. If yes, the operation goes to the step S13. If no, all the processing is terminated. All of the processing, except for the careful consideration of the result done at the step S16, may be replaced with processing done by a computer. Later, the part of the data analyzing process which corresponds to a feature of the invention will be discussed in more detail.

Figure 3:
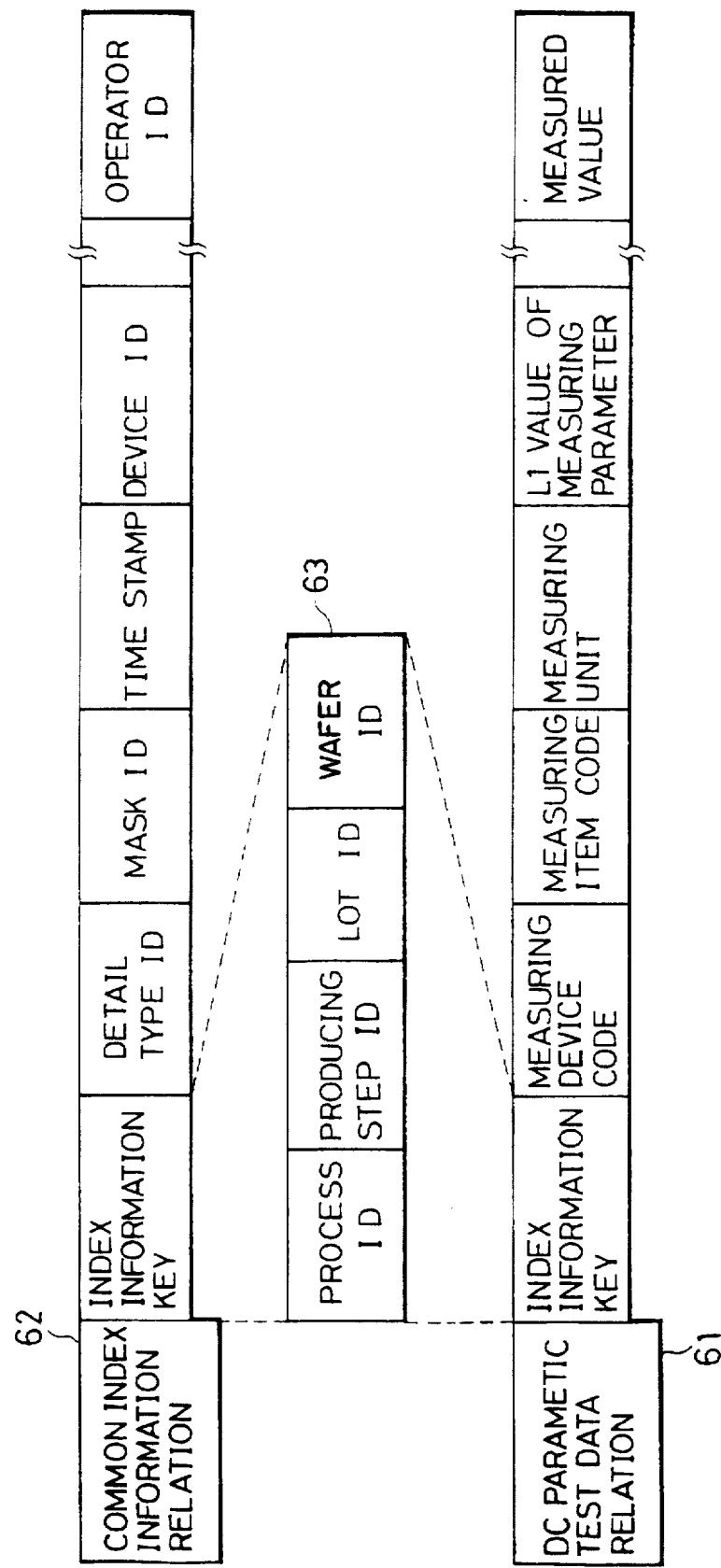
FIG. 3 is a view showing one relational structure of a database used in the present invention.

At first, the process for registering various kinds of collected data in the database (step S18) will be described as an example of registering DC parametric test data in the database. FIG. 3 shows a common index information relation 62 and a DC parametric test data relation 61. As shown in FIG. 3, the DC parametric test data relation 61 for storing actual data is coupled with the common index information relation 62 for storing an index and a history of a processed wafer through an index information key 63 consisting of a process ID, a producing step ID, a lot ID and a wafer ID when registering the data in the database. In addition to the index information key, the common index information relation 62 includes a detail type ID, a mask ID, a time stamp indicating a time, a device ID, an operator ID and so forth. The DC parametric test data relation 61 includes a measuring device code, a measuring item code, a measuring parameter, a measured value and so forth in addition to the index information key.

Then, the description will be oriented to the operation at the step S13 (see FIG. 2) for extracting the data to be analyzed from the database. In the extraction, the data retrieving program is required to create a quite flexible record selecting formula. In this embodiment, the coupling pattern of each relation provides a coupling field consisting of the lot ID and the wafer ID shown in FIG. 4. Based on the algorithm shown in FIG. 5, the record selecting formula is created for using the data retrieving program.

Figure 4:
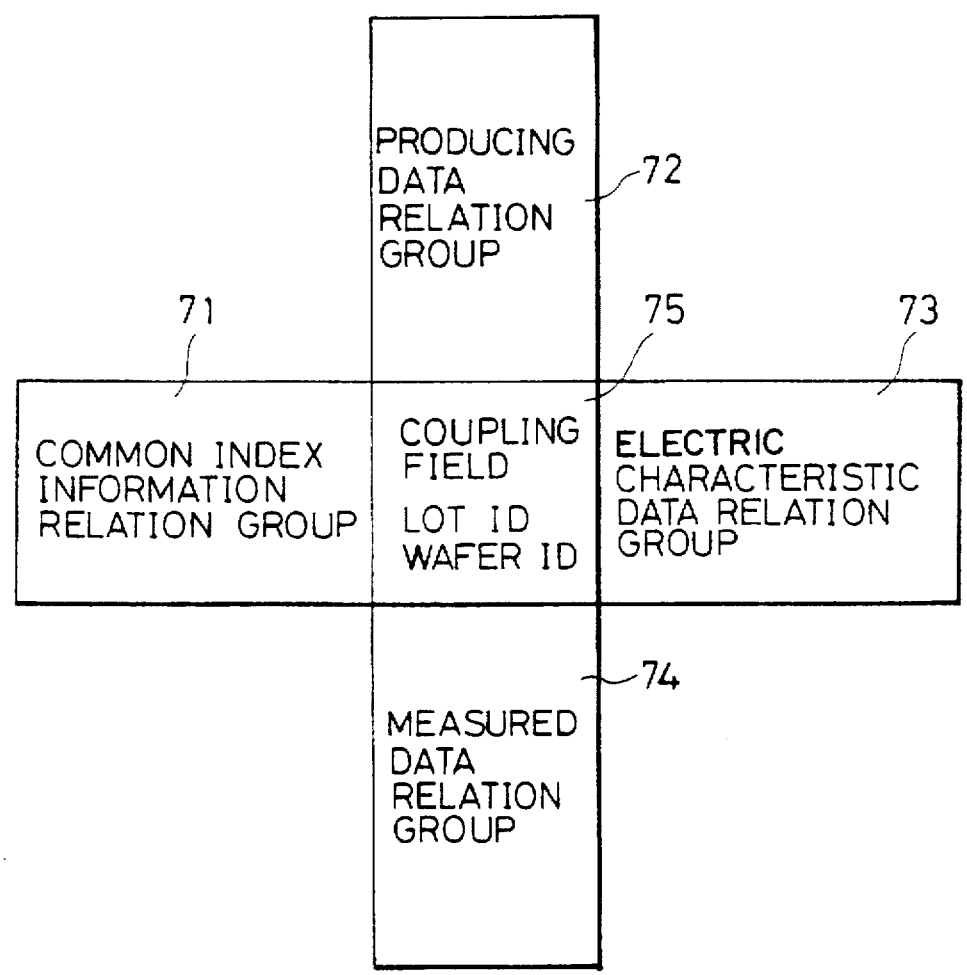
FIG. 4 is a view showing a relation coupling pattern when retrieving data according to the present invention.

FIG. 4 shows a relation between three data relation groups and a common index information relation. In FIG. 4, the producing data relation group 72 for storing data about a producing process, the measured data relation group 74 for storing measured data after production, the electric characteristic data relation group 73 for storing data about electric characteristics, and the common index information relation group 71 for storing common index information are coupled with the lot ID and the wafer ID of the coupling field 75.

Figure 5B:
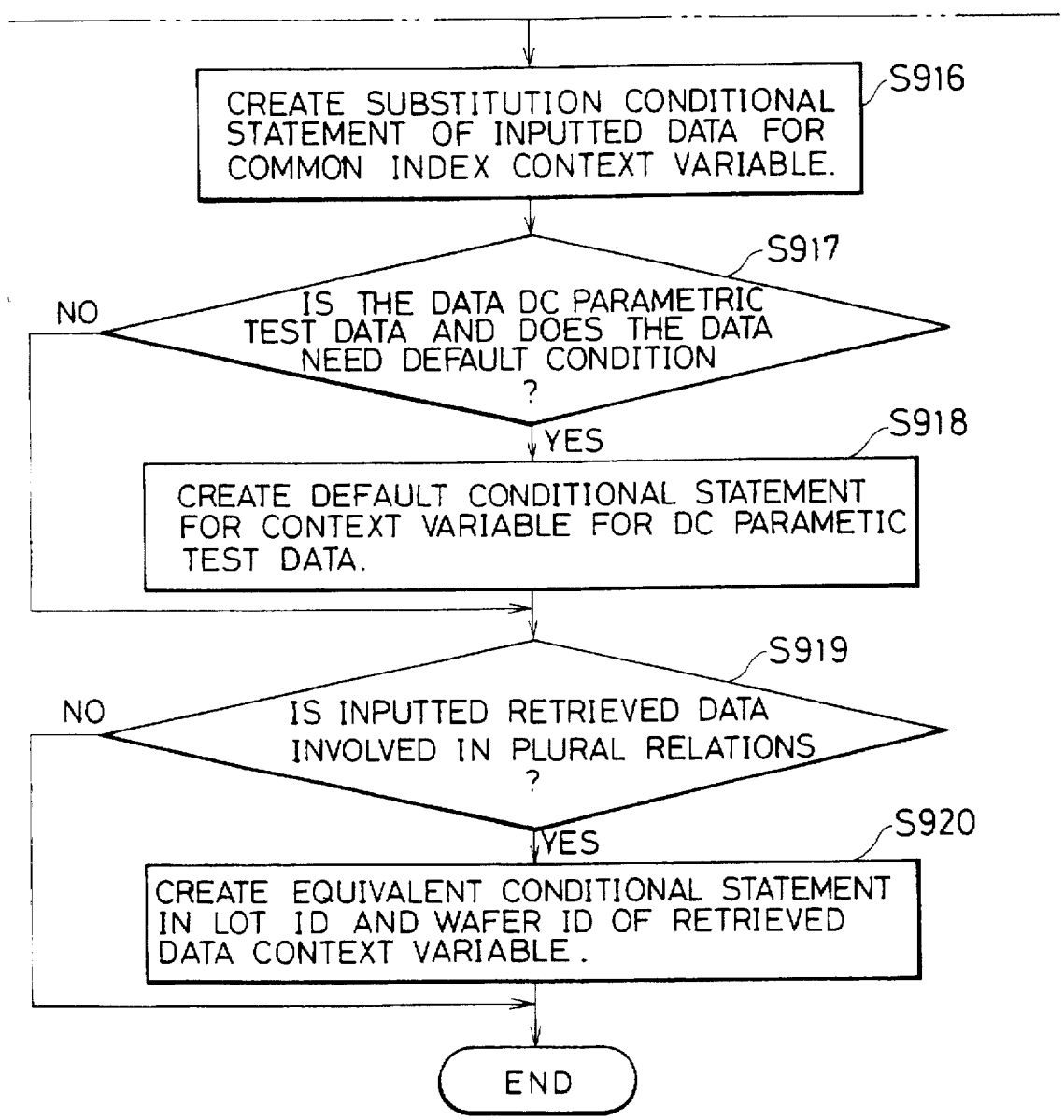

In turn, the process for creating the record selecting formula will be described as referring to the flowchart of FIG. 5 and the examples of FIGS. 6 and 7. FIG. 6 shows the example in which a relation between a length L of a channel of a MOS transistor and a threshold value Vth of the MOS transistor is described as a graph. FIG. 7 shows the example in which a relation between a thickness Tox of an oxidized film of the MOS transistor and the threshold value Vth is described as a graph. The examples shown in FIGS. 6 and 7 are illustrated in a manner to correspond to the steps of the flowchart of FIG. 5.

In creating the record selecting formula, at a step S911, a context variable table is created on the data inputted from a window for database retrieval. The context variable table is shown in FIG. 8. As shown, the context variable table includes specified retrieving data, a common index context variable and a retrieving data context variable. The specified retrieving data indicates a data name (variable) to be treated by a user. In the examples shown in FIGS. 6 and 7, L, Vth and Tox are the specified retrieving data. The retrieving data context variable is created for each of the relation groups for storing the data about a producing process, the measured data after production, and the data about electric characteristics, each of which data is actually collected as mentioned earlier. In the example shown in FIG. 6, the retrieving data context variable corresponds to B. The common index context variable is created for the common index relation group. In the example shown in FIG. 6, the common index context variable corresponds to A1 and A2.

Turning to a step S912, as shown in FIGS. 6 and 7, a record crossing conditional statement is created on the context variable table. At a step S913, as shown in FIG. 6, an equivalent conditional statement is created between the retrieving data context variables 81 and common index context variable 82. The conditional statement is equivalent in each of the process name ID, the producing step ID, the lot ID and the wafer ID all existing in any relation. In this example, A1.LOT_ID means LOT_ID of the variable A1. At a step S914, it is determined whether or not the inputted retrieved data has a hierarchical structure. If not, the operation goes to a step S916. If yes, at a step S915, the conditional statement is created about data having a hierarchical data attribute. In this example, the conditions of the length L and the width W of the channel of the MOS transistor are specified. At a step S916, an assignment conditional statement is created for each of a lot ID and a device ID inputted to the index data context variable on the screen. At a step S917, it is determined whether or not the data to be extracted is DC parametric test data and needs to specify a default condition to the hierarchical structure data. If the default condition is not needed to be specified, the operation goes to a step S919. If it is needed, at a step S918, the default conditional statement is created. Then, at a step S919, it is determined whether or not the data to be retrieved may be involved in plural relations except the common index information relation. If not, all the process is terminated. If yes, at a step S920, the equivalent conditional statement is created for the lot ID and the wafer ID inputted to the retrieved data context variable.

Figure 9:
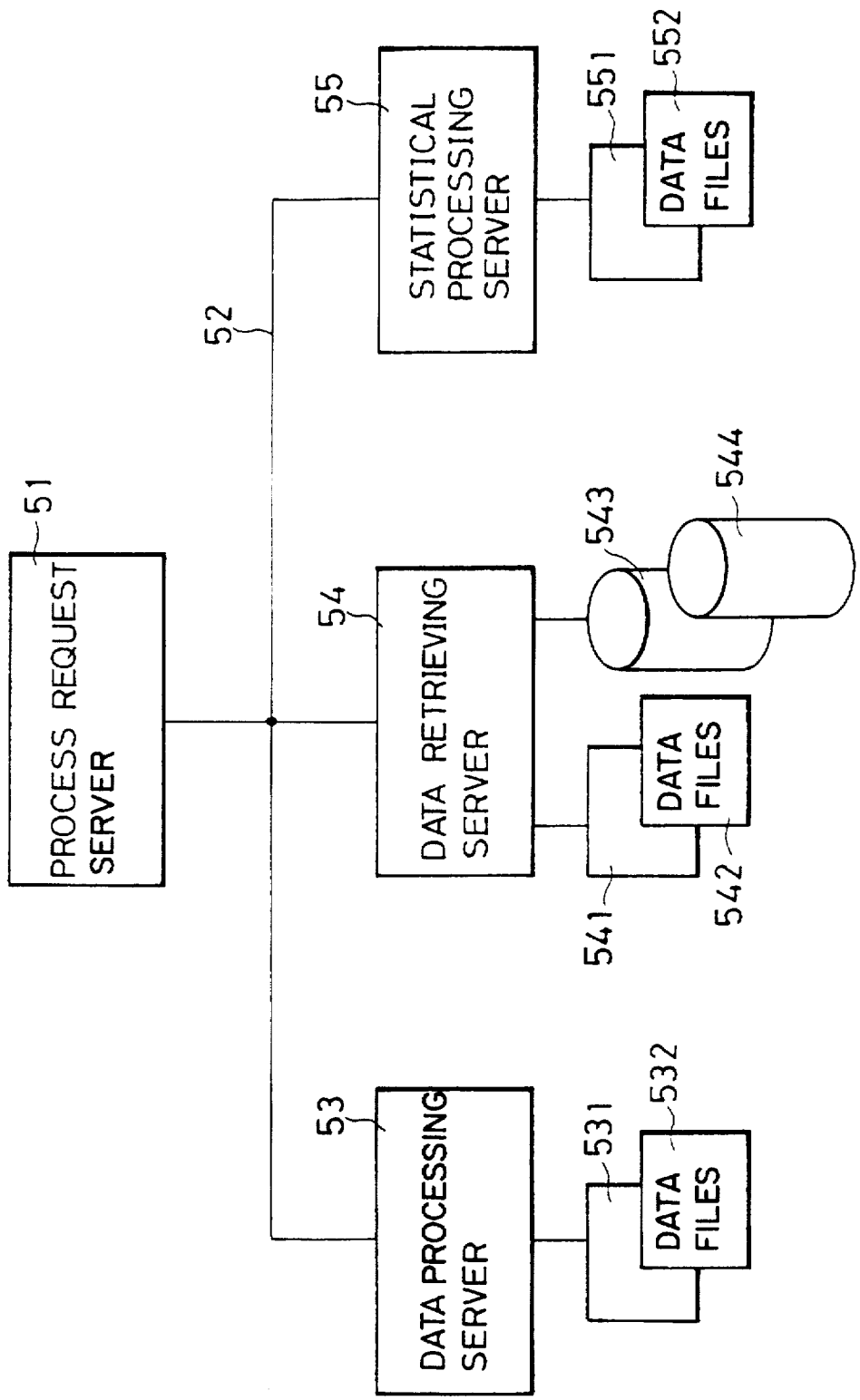
FIG. 9 is a view showing a module configuration inside of a system according to the present invention.

To distribute load imposed on the system processing, as shown in FIG. 9, the module in the application program is configured so that a process request server 51 may be separated from a data retrieval processing server 54. The process request server 51 creates a record selecting formula based on the data obtained through a man-machine interface with a system user. The data retrieval server 54 creates an actual data retrieving program based on the request content of the record selecting formula transmitted from the process request client 51 and executes the program. An inter-task communication 52 is executed through a network between the client module and each server module so as to execute a series of operations. In FIG. 9, a numeral 53 denotes a data processing server for doing a processing operation such as deletion of an abnormal measured value about the extracted data. A numeral 55 denotes a data statistical processing server for describing the data as a graph or doing regression analysis. Numerals 531, 532, 541, 542, 551 and 552 denote data files. Numerals 543 and 544 denote databases.

In turn, the description will be oriented to the statistical processing about the extracted or processed data mainly as referring to FIG. 10. As shown in FIG. 10, the user can easily handle this statistical processing with a window system on the screen of the computer without having to learn the specific commands used in the statistical processing. In the example shown in FIG. 10, at first, the user is requested to select a desired kind of processing. The statistical processing 41 is selected. Then, the user is requested to select a desired operation in the statistical processing 41. The description 42 of data as a graph is selected. Next, the user is requested to select a desired kind of graph. The plot 43 is selected. Then, the user is also requested to select a desired kind of statistical processing in the plot. The primary regression 44 is selected. At last, the user is requested to specify the amount of data kinds to be outputted to the plot. The second output 45 is specified. Through these selecting operations, a data table window screen 47 is displayed. On the screen 47, there are listed up a desired sample plot, a window 46 having data fields to be inputted to the plot, and the retrieved data and the processed data to be used in the plot. That is, the windows for prompting the user to select the necessary items in the statistical processing to be executed are displayed on the screen so that one window may correspond to the item selected on the previous window. The selection of the items on the windows in the corresponding manner may offer the user-friendly operating environment.

Figure 11A:
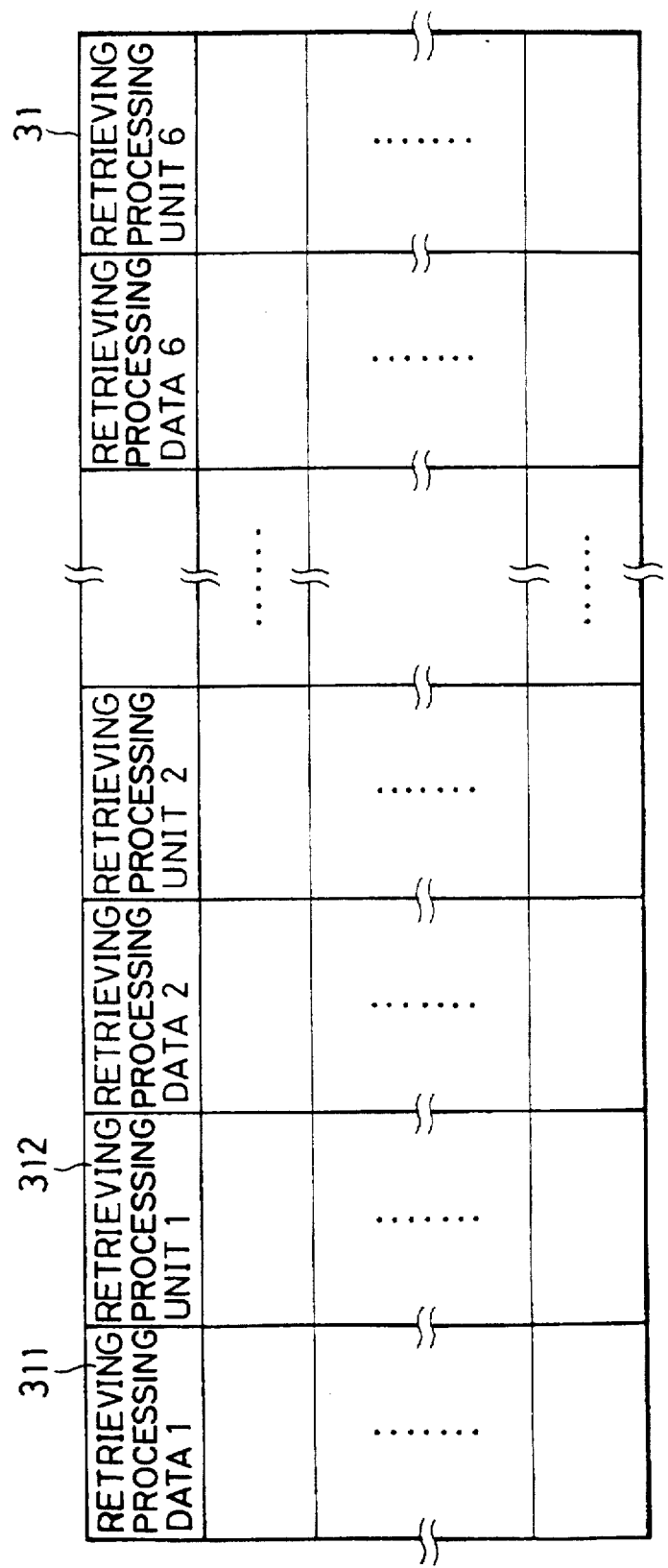
FIGS. 11a to 11b are views showing data structures for implementing relation of data between the processing systems according to the present invention.
Figure 11B:
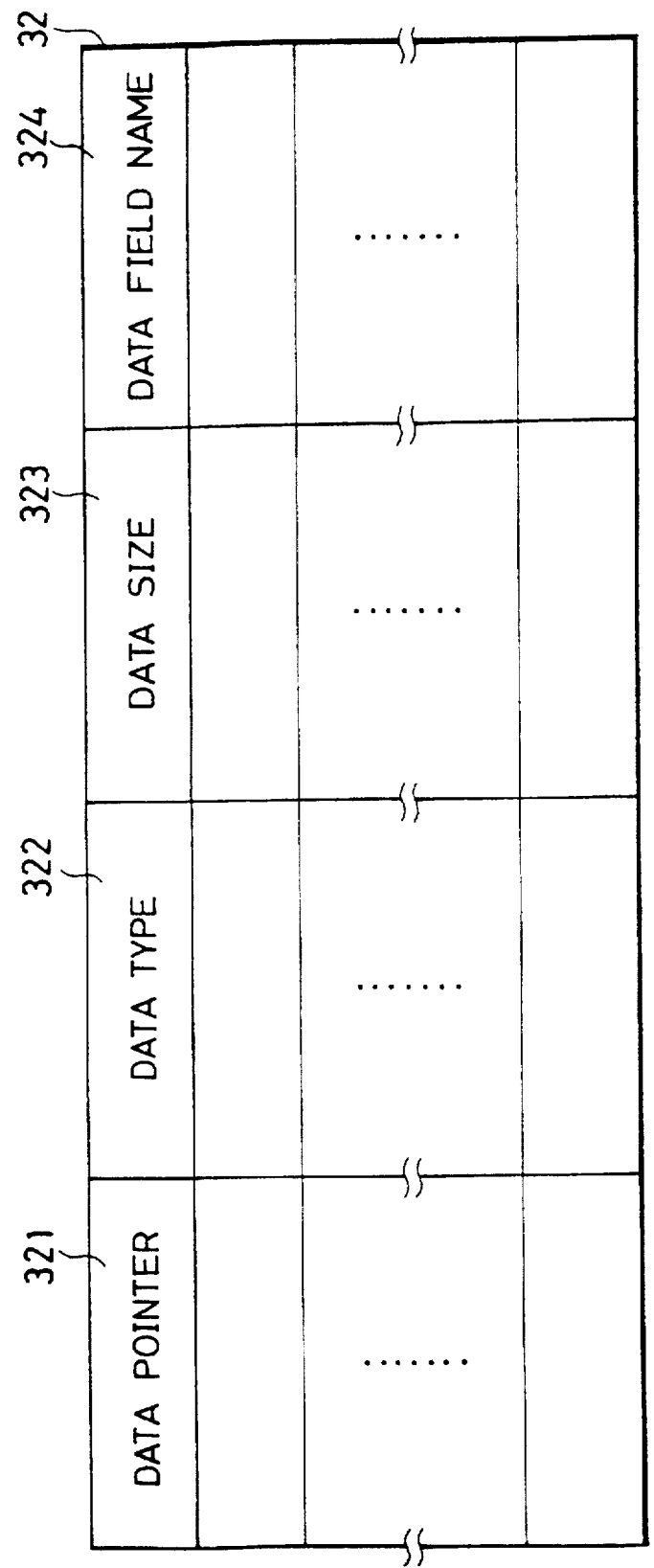

Before executing the statistical processing, the conversion of data to be processed or creation of a file has to be executed. The data conversion or the file creation can be automatically executed by the computer itself. Concretely, with the storing method for keeping a relation between a data entity 31 as shown in FIG. 11a and its data attribute 32 as shown in FIG. 11b, the computer enables to automatically execute a format conversion about data requested by the system user before each processing stage. The data entity 31 consists of retrieving/processing data 311 which corresponds to the actual data and a retrieving/processing unit 312 which literally corresponds to the unit of the retrieving/ processing data 311. The attribute 32 consists of a data pointer 321 for pointing to the data entity 31, a data type 322 for indicating a data type such as a real number or an integer, a data size 323 for literally indicating a size of data, and a data field name 324 for indicating a name of data. The processing program operates to perform the format conversion of data by referring to the attribute 32. For example, if the data type 322 indicates the real number, the data is processed as a real number.

As set forth above, the system for supporting data analysis in a VLSI process according to the present invention offers a very flexible database retrieving operation without the user having to be conscious of the detailed structure of the database and allows a user to do the statistical processing or the data processing without having to learn complicated commands for a tool software provided in the computer. This system makes great contribution to greatly reducing a time in the work which does not need the intellectual consideration of a system user or developer.

Many widely different embodiments of the present invention may be constructed without departing from the spirit and scope of the present invention. It should be understood that the present invention is not limited to the specific embodiments described in the specification, except as defined in the appended claims.

What is claimed is:

1. A system for supporting data analysis of a VLSI device production process comprising:

registering means for registering in a database process data descriptive of a production process, measured data relating to processed devices, and characteristic data descriptive of electric characteristics of the processed devices, the process, measured and characteristic data being collected as part of the VLSI device production process;

extracting means for extracting data used for the data analysis from said database;

data processing means for processing the extracted data;

statistical processing means for performing statistical processing of at least one of the processed data and the extracted data; and formatting means for automatically converting a format of the extracted data into a format compatible with said data processing means and said statistical processing means before the data processing and the statistical processing, said data processing means and said statistical processing means each comprising data managing means for relating a data entity with a corresponding data attribute when storing data.

2. The system for supporting data analysis of a VLSI device production process as claimed in claim 1, wherein said registering means registers in said database the process, measured and characteristic data in collected data relation groups and a common index information relation group including index information and a history of each processed device, the collected data relation groups and the common index relation group being coupled through an index information key consisting of a process identification, a producing step identification, a lot identification and a device identification provided in both the collected data and common index relation groups.

3. The system for supporting data analysis of a VLSI device production process as claimed in claim 2, wherein said extracting means comprises record selection means for dynamically creating a record selecting formula for extracting data from said database by using a retrieved data context variable table and a common index information context variable table.

4. A system for supporting data analysis in a VLSI process as claimed in claim 3, wherein said extracting means further includes means for extracting data in a manner to independently separate a client module for creating said record selecting formula and retrieve request information from a server module for creating a data retrieving program based on said retrieve request information and executing said data retrieving program and to communicate said client module with said server module.

5. The system for supporting data analysis of a VLSI device production process as claimed in claim 4, wherein said server module includes a data working server, a data retrieving server, and a statistical processing server.

6. The system for supporting data analysis of a VLSI device production process as claimed in claim 3, wherein the common index information context variable table includes specified retrieving data, a common index context variable and a retrieving data context variable.

7. The system for storing data analysis of a VLSI device production process as claimed in claim 1, wherein said data processing means and said data statistical processing means each comprise selection means for window selecting hierarchically grouped operational items.

8. A data analysis method for a VLSI device production process comprising the steps of:

a) registering in a database process data descriptive of a production process, measured data relating to processed devices, and characteristic data descriptive of electric characteristics of the processed devices, the process, measured and characteristic data being collected as part of the VLSI device production process;

b) extracting data used for the data analysis from the database;

c) processing the extracted data;

d) statistically processing at least one of the processed data and the extracted data; and e) automatically converting a format of the extracted data into a format compatible with processing performed in said steps c) and d) prior to processing of the extracted data, said steps e) and d) each comprising data managing for relating a data entity with a corresponding data attribute when storing data.

9. The data analysis method as claimed in claim 8, wherein said steps c) and d) each comprise window selecting hierarchically grouped operational items.

10. The data analysis method as claimed in claim 8, wherein said step a) comprises registering in the database the process, measured and characteristic data in collected data relation groups and a common index information relation group including index information and a history of each processed device, the collected data relation groups and the common index relation group being coupled through an index information key consisting of a process identification, a producing step identification, a lot identification and a device identification provided in both the collected data and common index relation groups.

11. The data analysis method as claimed in claim 10, wherein said step b) comprises dynamically creating a record selecting formula for extracting data from the database by using retrieved data context variables and a common index information context variable in the relation groups.

12. The data analysis method as claimed in claim 11, wherein the common index information context variables include specified retrieving data, a common index context variable and a retrieving data context variable.

* * * * *